(12) United States Patent
Kim et al.

(10) Patent No.: US 11,942,446 B2
(45) Date of Patent: Mar. 26, 2024

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventors: Hyoeun Kim, Cheonan-si (KR); Sunkyoung Seo, Cheonan-si (KR); Seunghoon Yeon, Suwon-si (KR); Chajea Jo, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/165,429

(22) Filed: Feb. 2, 2021

(65) Prior Publication Data

US 2021/0398929 A1  Dec. 23, 2021

(30) Foreign Application Priority Data

Jun. 22, 2020  (KR) .......................... 10-2020-0076033

(51) Int. Cl.
*H01L 23/31* (2006.01)
*H01L 23/00* (2006.01)
*H01L 23/538* (2006.01)
*H01L 25/065* (2023.01)

(52) U.S. Cl.
CPC .......... *H01L 24/14* (2013.01); *H01L 23/3157* (2013.01); *H01L 23/5384* (2013.01); *H01L 23/5386* (2013.01); *H01L 25/0657* (2013.01); *H01L 2224/14181* (2013.01)

(58) Field of Classification Search
CPC . H01L 24/14; H01L 23/3157; H01L 23/5384; H01L 23/5386; H01L 25/0657; H01L 2224/14181
See application file for complete search history.

(56) References Cited

U.S. PATENT DOCUMENTS

| | | |
|---|---|---|
| 5,620,131 A | 4/1997 | Kane et al. |
| 6,800,169 B2 | 10/2004 | Liu et al. |
| 6,878,633 B2 | 4/2005 | Raskin et al. |
| 9,508,665 B2 | 11/2016 | Beyne et al. |
| 9,627,347 B2 | 4/2017 | Aoyagi et al. |

(Continued)

*Primary Examiner* — Trang Q Tran
(74) *Attorney, Agent, or Firm* — F. Chau & Associates, LLC

(57) ABSTRACT

A semiconductor package includes at least one second semiconductor chip stacked on a first semiconductor chip. An underfill layer is interposed between the first semiconductor chip and the at least one second semiconductor chip. The first semiconductor chip includes a first substrate, a first passivation layer disposed on the first substrate. The first passivation layer includes a first recess region. A first pad covers a bottom surface and sidewalls of the first recess region. The at least one second semiconductor chip includes a second substrate, a second passivation layer disposed adjacent to the first substrate, a conductive bump protruding outside the second passivation layer towards the first semiconductor chip and an inter-metal compound pattern disposed in direct contact with both the conductive bump and the first pad. The underfill layer is in direct contact with both the conductive bump and the inter-metal compound pattern.

19 Claims, 18 Drawing Sheets

(56) References Cited

U.S. PATENT DOCUMENTS

| | | | |
|---|---|---|---|
| 9,978,710 B2 | 5/2018 | Dubey et al. | |
| 10,461,052 B2 | 10/2019 | Jiang | |
| 2005/0194695 A1* | 9/2005 | Lin | H01L 24/11 257/E21.705 |
| 2015/0061120 A1* | 3/2015 | Yang | H01L 24/96 257/737 |
| 2015/0076713 A1* | 3/2015 | Tsai | H01L 24/19 257/782 |
| 2015/0228591 A1* | 8/2015 | Kim | H01L 21/563 438/109 |
| 2015/0380382 A1 | 12/2015 | Uno et al. | |
| 2016/0148888 A1* | 5/2016 | Ryu | H01L 24/17 257/737 |
| 2016/0260679 A1 | 9/2016 | Mirpuri et al. | |
| 2017/0133346 A1* | 5/2017 | Chiu | C23C 18/42 |
| 2017/0338206 A1* | 11/2017 | Seo | H01L 25/0657 |
| 2019/0295989 A1* | 9/2019 | Yu | H01L 25/50 |
| 2020/0006226 A1 | 1/2020 | Hu et al. | |
| 2020/0098720 A1 | 3/2020 | Yu et al. | |
| 2021/0028144 A1* | 1/2021 | Lu | H01L 24/12 |
| 2021/0066226 A1* | 3/2021 | Chu | H01L 24/11 |

* cited by examiner

SEMICONDUCTOR PACKAGE AND METHOD OF MANUFACTURING THE SAME

CROSS-REFERENCE TO RELATED APPLICATION

This application claims priority under 35 U.S.C. § 119 to Korean Patent Application No. 10-2020-0076033, filed on Jun. 22, 2020 in the Korean Intellectual Property Office, the disclosure of which is incorporated by reference in its entirely herein.

TECHNICAL FIELD

The present inventive concepts relate to a semiconductor package and a method of manufacturing the same.

DISCUSSION OF RELATED ART

An integrated circuit chip may be prepared in the form of a semiconductor package for applying the integrated circuit chip to an electronic product. In a typical semiconductor package, a semiconductor chip may be mounted on a printed circuit board (PCB) and may be electrically connected to the PCB through bonding wires or bumps. As the electronic industry has developed, various techniques for increasing the reliability and durability of semiconductor packages have been studied.

SUMMARY

Exemplary embodiments of the present inventive concepts provide a semiconductor package with increased reliability.

Exemplary embodiments of the present inventive concepts also provide a method of manufacturing a semiconductor package, which increases the yield of the manufactured semiconductor package.

According to an exemplary embodiment of the present inventive concepts, a semiconductor package includes at least one second semiconductor chip stacked on a first semiconductor chip. An underfill layer is interposed between the first semiconductor chip and the at least one second semiconductor chip. The first semiconductor chip includes a first substrate and a first passivation layer disposed on the first substrate. The first passivation layer includes a first recess region. A first pad covers a bottom surface and sidewalls of the first recess region. The at least one second semiconductor chip includes a second substrate, a second passivation layer disposed adjacent to the first substrate, a conductive bump protruding outside the second passivation layer towards the first semiconductor chip and an inter-metal compound pattern disposed in direct contact with both the conductive bump and the first pad. The underfill layer is in direct contact with both the conductive bump and the inter-metal compound pattern.

According to an exemplary embodiment of the present inventive concepts, a semiconductor package includes at least one semiconductor chip stacked on a package substrate. An underfill layer is interposed between the package substrate and the at least one semiconductor chip. The package substrate includes a first passivation layer including a first recess region and a first pad covering a bottom surface and sidewalls of the first recess region. The first pad has a concave top surface. The at least one semiconductor chip includes a conductive bump protruding toward the package substrate and an inter-metal compound pattern disposed in direct contact with both the conductive bump and the first pad. The underfill layer is in direct contact with both the conductive bump and the inter-metal compound pattern.

According to an exemplary embodiment of the present inventive concepts, a semiconductor package includes at least one second semiconductor chip stacked on a first semiconductor chip. An underfill layer is interposed between the first semiconductor chip and the at least one second semiconductor chip. The first semiconductor chip includes a first substrate, a first through-electrode penetrating the first substrate, a first passivation layer disposed ort the first substrate and including a first recess region exposing the first through-electrode and a first pad covering a bottom surface and sidewalk of the first recess region. The first pad is in direct contact with the first through-electrode. The at least one second semiconductor chip includes a second substrate, a second passivation layer adjacent to the first substrate, a conductive bump protruding outside the second passivation layer toward the first semiconductor chip and an inter-metal compound pattern disposed in direct contact with both the conductive bump and the first pad. The underfill layer is in direct contact with both the conductive bump and the inter-metal compound pattern. A width of the conductive bump is less than a maximum width of the inter-metal compound pattern.

According to an exemplary embodiment of the present inventive concepts, a method of manufacturing a semiconductor package includes forming a wafer structure including a first substrate and a first passivation layer covering the first substrate. At least one recess region is formed in the first passivation laver. A first pad is formed that covers sidewalls and a bottom surface of the at least one recess region. The first pad includes a first metal. A first conductive bonding layer is formed on the first pad. The first conductive bonding layer includes a second metal. At least one first semiconductor chip is formed on the wafer structure. The at least one first semiconductor chip includes a conductive bump including the first metal and a second conductive bonding layer disposed in direct contact with the conductive bump and including the second metal. The second conductive bonding layer is placed in direct contact with the first conductive bonding layer. A thermal compression process is formed to melt the first and second conductive bonding layers to form an inter-metal compound pattern including an alloy of the first metal and the second metal. The thermal compression process is performed at a first process temperature. The first process temperature is higher than a melting point of the second metal and is lower than a melting point of the first metal.

BRIEF DESCRIPTION OF THE DRAWINGS

The inventive concepts will become more apparent in view of the attached drawings and accompanying detailed description.

DETAILED DESCRIPTION OF EXEMPLARY EMBODIMENTS

Hereinafter, exemplary embodiments of the present inventive concepts will be described in more detail with reference to the accompanying drawings.

Figure 1:
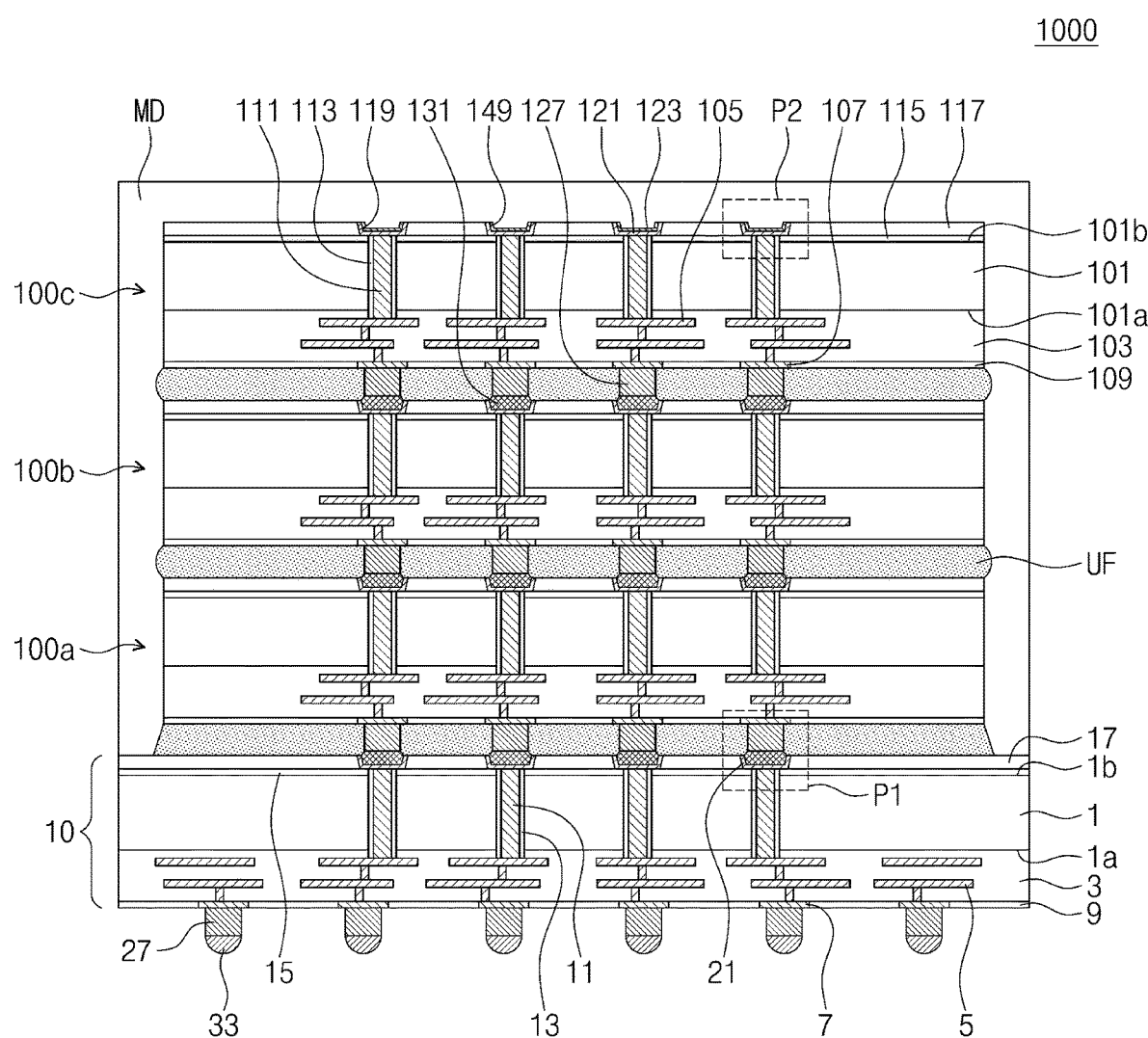
FIG. 1 is a cross-sectional view illustrating a semiconductor package according to an exemplary embodiment of the present inventive concepts.

FIG. 1 is a cross-sectional view illustrating a semiconductor package according to an exemplary embodiment of the present inventive concepts.

Referring to FIG. 1, a semiconductor package 1000 according to an exemplary embodiment of the present inventive concepts may include a first semiconductor chip 10, and second to fourth semiconductor chips 100a, 100b and 100c sequentially stacked on the first semiconductor chip 10 (e.g., in a vertical direction substantially parallel to a thickness direction of the first semiconductor chip 10). In an exemplary embodiment, the type of the first semiconductor chip 10 may be different from the types of each of the second to fourth semiconductor chips 100a, 100b and 100c. For example, in an exemplary embodiment, the first semiconductor chip 10 may be a logic circuit chip. The second to fourth semiconductor chips 100a, 100b and 100c may be the same memory chips (e.g., DRAM chips, etc.). In the exemplary embodiment shown in FIG. 1, one logic circuit chip and three memory chips are stacked. However, exemplary embodiments of the present inventive concepts are not limited thereto and the number of the logic circuit chip and the memory chips may be variously changed in other exemplary embodiments. As shown in the exemplary embodiment of FIG. 1, a width of the first semiconductor chip 10 (e.g., length in a direction parallel to an upper surface of the first semiconductor chip 10) may be greater than the widths of the second to fourth semiconductor chips 100a, 100b and 100c. In an exemplary embodiment, the widths of the second to fourth semiconductor chips 100a, 100b and 100c may be substantially the same. Underfill layers UF may be interposed between the first to fourth semiconductor chips 10, 100a, 100b and 100c. A mold layer MD may cover the first to fourth semiconductor chips 10, 100a, 100b and 100c. For example, as shown in the exemplary embodiment of FIG. 1, the mold layer MD may cover lateral sides of the second and third semiconductor chips 100a, 100b, a partial portion of the top surface of the first semiconductor chip 10 exposed by the second semiconductor chip 100a and lateral sides and a top surface of the fourth semiconductor chip 100c. In an exemplary embodiment, the mold layer MD may include an insulating resin such as an epoxy molding compound (EMC). The mold layer MD may further include fillers, and the fillers may be dispersed in the insulating resin. The fillers may include, for example, silicon oxide ($SiO_2$). The underfill layer UF may include a thermosetting resin or a photocurable resin. In addition, the underfill layer UF may further include organic fillers or inorganic fillers.

The first semiconductor chip 10 may include a first substrate 1. The first substrate 1 may include a first substrate front surface 1a and a first substrate back surface 1b which are opposite to each other. For example, as shown in the exemplary embodiment of FIG. 1, the back surface 1b of the first substrate 1 may be adjacent to the second semiconductor chip 100a. A first interlayer insulating layer 3 may be disposed on the front surface 1a of the first substrate 1. First transistors and multi-layered first interconnection lines 5 may be disposed in the first interlayer insulating layer 3. While the exemplary embodiment of FIG. 1 shows the multi-layered first interconnection lines 5 having two layers, exemplary embodiments of the present inventive concepts are not limited thereto and the numbers of the layers of the multi-layered first interconnection lines 5 may vary in other exemplary embodiments. First front pads 7 may be disposed on the first interlayer insulating layer 3. For example, as shown in the exemplary embodiment of FIG. 1, the first front pads 7 may be disposed on a bottom surface of the first interlayer insulating layer 3. First conductive bumps 27 may be bonded to the first front pads 7, respectively. A solder layer 33 may be bonded to a bottom of each of the first conductive bumps 27. The first interlayer insulating layer 3 may be covered by a first front passivation layer 9. The back surface 1b of the first substrate 1 may be covered by a first buffer layer 15. The first buffer layer 15 may be covered by a first back passivation layer 17. For example, as shown in the exemplary embodiment of FIG. 1, a lower surface of the first back passivation layer 17 may directly contact an upper surface of the first buffer layer 15. A first through-electrode 11 may penetrate the first buffer layer 15, the first substrate 1, and a partial portion of the first interlayer insulating layer 3 (e.g., an upper portion of the first interlayer insulating layer 3). A first through-insulating layer 13 may be interposed between the first through-electrode 11 and the first substrate 1. For example, the first through-insulating layer 13 may cover lateral sides of the first through-electrode 11. A first recess region 19 (FIG. 2A) may be disposed in the first back passivation layer 17 and may expose a top surface the first through-electrode 11. Sidewalls and a bottom surface of the first recess region 19 may be covered by a first back pad 21. The first back pad 21 may be electrically connected to the first through-electrode 11. For example, a lower surface of the first back pad 21 may directly contact an upper surface of the first through-electrode 11.

Each of the second to fourth semiconductor chips 100a, 100b and 100c may include a second substrate 101. The second substrate 101 may include a front surface 101a and a back surface 101b which are opposite to each other. For example, the front surface 101a of the second substrate 101 of the second semiconductor chip 100a may be adjacent to the first semiconductor chip 10 and the back surface 101b of the second substrate 101 of the second semiconductor chip 100a may be adjacent to the third semiconductor chip 100b. A second interlayer insulating layer 103 may be disposed on the front surface 101a of the second substrate 101. Second transistors multi-layered second interconnection lines 105 may be disposed in the second interlayer insulating layer 103. Second front pads 107 may be disposed on the second interlayer insulating layer 103. For example, as shown in the exemplary embodiment of FIG. 1, the second front pads 107 may be disposed on a lower portion of the second interlayer insulating layer 103. Second conductive bumps 127 may be bonded to the second front pads 107, respectively. An inter-metal compound pattern 131 may be bonded to a bottom of each of the second conductive bumps 127. The second interlayer insulating layer 103 may be covered by a second front passivation layer 109. The second conductive bumps 127 may protrude outside of the second front passivation layer 109 and extend toward the first semiconductor chip 10. The back surface 101*b* of the second substrate 101 may be covered by a second buffer layer 115. The second buffer layer 115 may be covered by a second back passivation layer 117. A second through-electrode 111 may penetrate the second buffer layer 115, the second substrate 101, and a partial portion of the second interlayer insulating layer 103 (e.g., an tapper portion of the second interlayer insulating layer 103). A second through-insulating layer 113 may be interposed between the second through-electrode 111 and the second substrate 101. For example, the second through-insulating layer 113 may cover lateral sides of the second through-electrode 111. A second recess region 119 may be disposed in the second back passivation layer 117. A sidewall and a bottom surface of the second recess region 119 may be covered by a second back pad 121. The second back pad 121 may be electrically connected to the second through-electrode 111. For example, as shown in the exemplary embodiment of FIG. 1, an upper surface of the second through-electrode 111 may directly contact a lower surface of the second back pad 121.

In an exemplary embodiment, the first and second substrates 1 and 101 may each independently be a semiconductor substrate, a single-crystalline silicon substrate, or a silicon-on-insulator (SOI) substrate. Each of the first and second interlayer insulating layers 3 and 103 may include a single-layer or multi-layer including at least one of a silicon oxide layer, a silicon nitride layer, a silicon oxynitride layer, or a porous insulating layer. Each of the first and second buffer layers 15 and 115 may be formed of, for example, a silicon oxide layer. Each of the first and second through-insulating layers 13 and 113 may be formed of, for example, a silicon oxide layer. Each of the first and second front pads 7 and 107 may include a metal such as at least one compound selected from copper, aluminum, cobalt, nickel, and gold. Each of the first and second back pads 21 and 121 and the first and second conductive bumps 27 and 127 may include a first metal. For example, the first metal may include at least compound selected from copper, cobalt and nickel. The inter-metal compound pattern 131 may include the first metal and a second metal that is different from the first metal (e.g., an alloy of the first and second metals). In an exemplary embodiment, the second metal may have a melting point that is lower than a melting point of the first metal. For example, the second metal may include at least one compound selected from tin (Sn) or gold. The inter-metal compound pattern 131 may include an alloy of the first metal and the second metal. The first front passivation layer 9, the first back passivation layer 17, the second front passivation layer 109 and the second back passivation layer 117 may be formed of, for example, a photo-imagable dielectric (PID) resin. In an exemplary embodiment, the solder layer 33 may include, for example, Sn or SnAg.

FIGS. 2A to 2D are enlarged views of a portion 'P1' of FIG. 1 according to exemplary embodiments of the present inventive concepts.

Figure 2A:
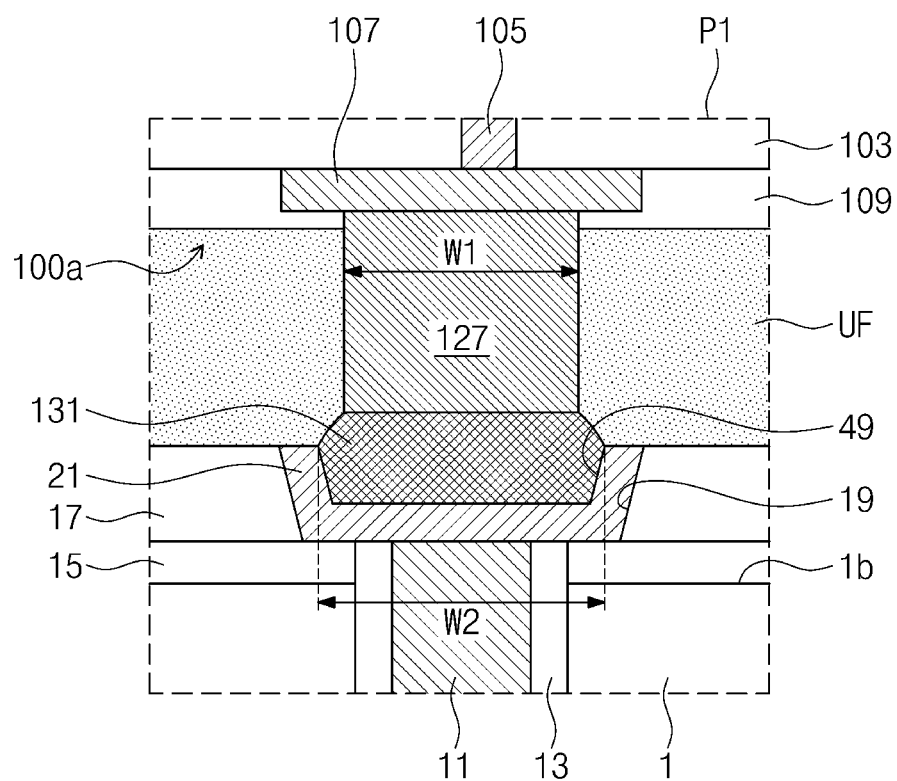
FIGS. 2A to 2D are enlarged views of portion P1 of FIG. 1 according to exemplary embodiments of the present inventive concepts.

Referring to the exemplary embodiment of FIG. 2A, sidewalk of the second conductive bump 127 may directly contact the underfill layer UF. In addition, the underfill layer UF may also directly contact the inter-metal compound pattern 131. The second conductive bump 127 may have a first width W1 (e.g., length in a direction parallel to an upper surface of the first substrate 1). The first back pad 21 may be formed with a uniform thickness in the first recess region 19. The first back pad 21 may have a first concave upper region 49 (e.g., a top surface) disposed along a profile of an inner surface of the first recess region 19. An entrance (e.g., a top end) of the first concave upper region 49 may have a second width W2. As shown in the exemplary embodiment of FIG. 2A, the second width W2 may be greater than the first width W1. The inter-metal compound pattern 131 may directly contact both the first back pad 21 and the second conductive bump 127. The inter-metal compound pattern 131 may electrically connect the first back pad 21 to the second conductive hump 127. The inter-metal compound pattern 131 may fill the first concave upper region 49. The inter-metal compound pattern 131 may protrude from a top surface of the first back passivation layer 17. The protruding portion of the inter-metal compound pattern 131 may be higher than a lower surface of the adjacent underfill layer UF. A maximum width of the inter-metal compound pattern 131 may be substantially equal to the second width W2 and is greater than the first width W1.

Figure 2B:
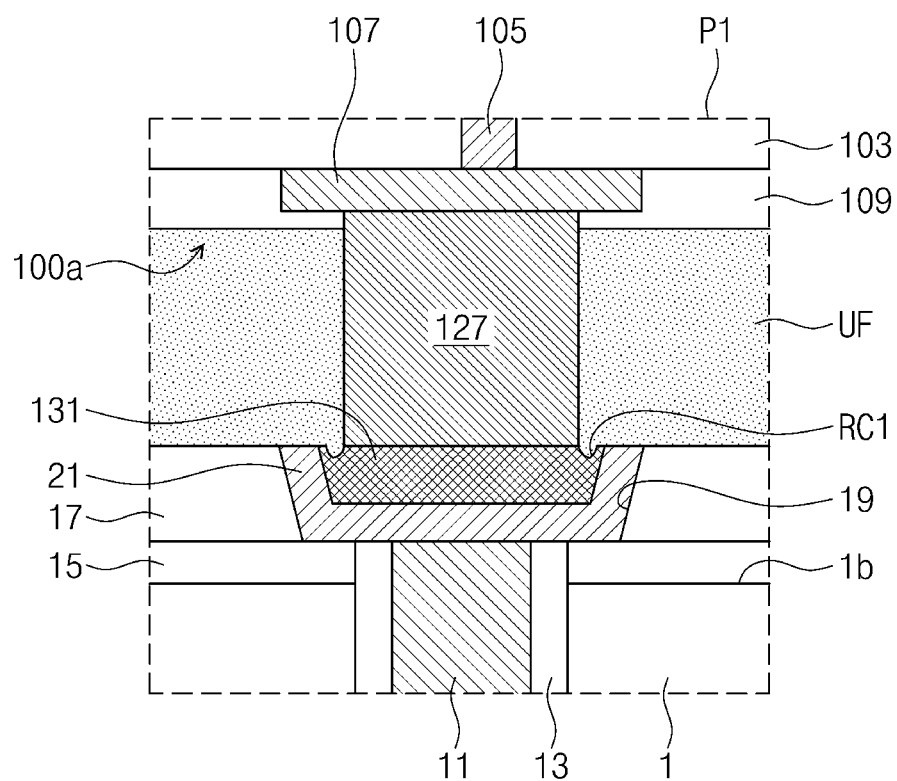

In another exemplary embodiment as shown in FIG. 2B, the inter-metal compound pattern 131 may have a concave top surface RC1 disposed adjacent to the second conductive bump 127. For example, the concave top surface RC1 may be disposed adjacent to the sidewalls of the second conductive bump 127. A portion of the underfill layer UF may protrude toward the concave top surface RC1 of the inter-metal compound pattern 131. A lower surface of the underfill layer UF may be disposed at a level that is lower than the level of the lower surface of the adjacent second conductive bump 127. As shown in the exemplary embodiment of FIG. 2B, the inter-metal compound pattern 131 may not protrude from the top surface of the first back passivation layer 17 and the level of an upper surface of the inter-metal compound pattern 131 (e.g., the partial portion disposed directly below the second conductive bump 127) may be substantially the same as the level of the top surface of the first back passivation layer 17. As shown in the exemplary embodiment of FIG. 2B, an upper lateral end portion of the inter-metal compound pattern 131 pattern disposed adjacent to the concave top surface RC1 may contact an upper portion of the inner sidewall of the first back pad 21.

Figure 2C:
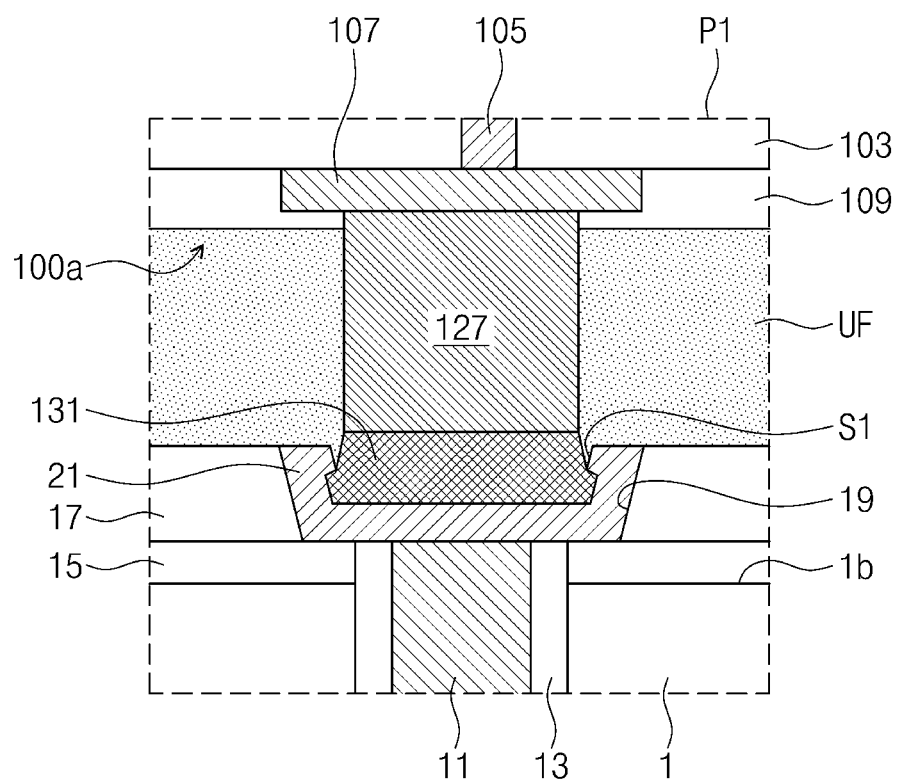

Alternatively, referring to the exemplary embodiment of FIG. 2C, the upper lateral end portions of the inter-metal compound pattern 131 may be spaced apart from an upper portion of at least one inner sidewall S1 of the first back pad 21. A portion of the underfill layer UF may be interposed between the upper portion of the at least one inner sidewall S1 of the first back pad 21 and at least one sidewall of the inter-metal compound pattern 111 such as the upper lateral end portions of the inter-metal compound pattern 131. The underfill layer UF may directly contact the upper portion of the at least one inner sidewall S1 of the first back pad 21. As shown in the exemplary embodiment of FIG. 2C, a lower portion of the inter-metal compound pattern 131 may be wider than an upper portion of the inter-metal compound pattern 131.

Figure 2D:
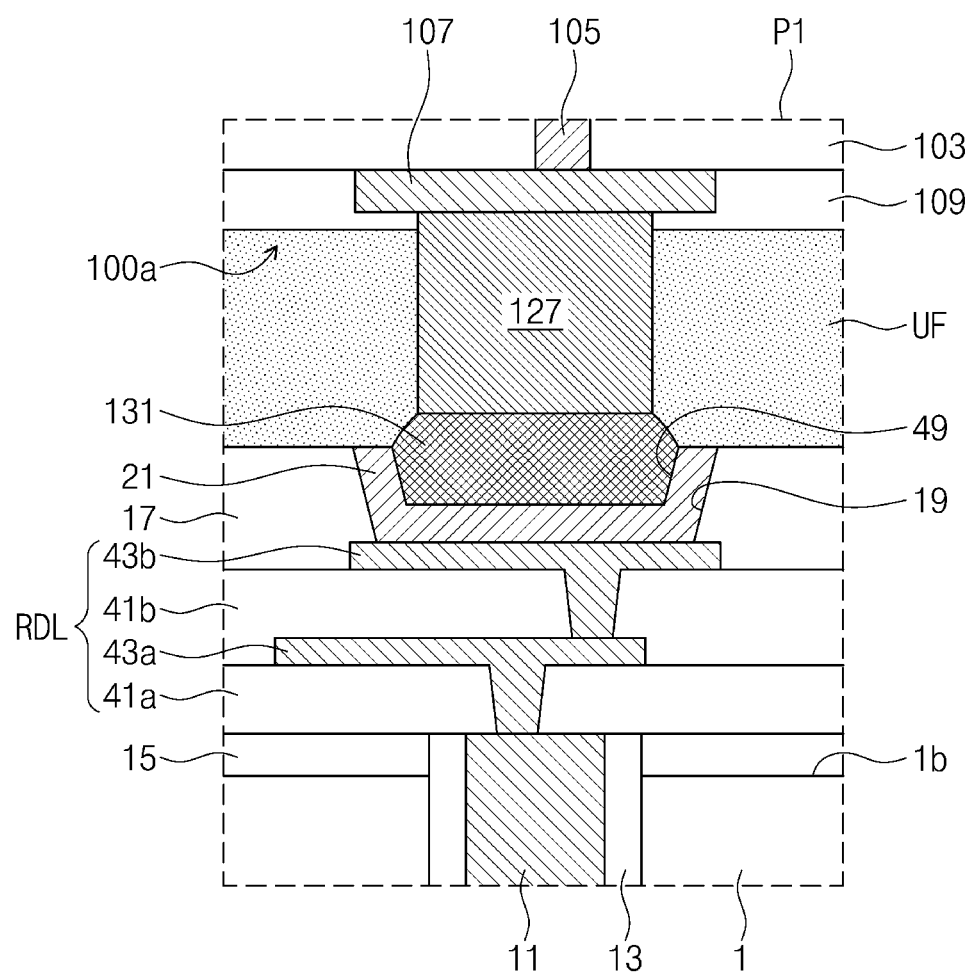

Alternatively, referring to the exemplary embodiment of FIG. 21D, a redistribution layer RDL may be interposed between the first back passivation layer 17 and the first buffer layer 15 disposed on the first substrate 1. As shown in the exemplary embodiment of FIG. 2D, the redistribution layer RDL may include first and second redistribution insulating layers 41*a* and 41*b* and first and second redistribution patterns 43*a* and 43*b*. While the exemplary embodiments of FIG. 2D shows the redistribution layer RDL including two redistribution insulating layers and two redistribution patterns, the numbers of the redistribution insulating layers and redistribution patterns may vary in other exemplary embodiments and the redistribution layer RDL may include at least one redistribution insulating layer and at least one redistribution pattern disposed in direct contact therewith. As shown in the exemplary embodiment of FIG. 2D, the first redistribution pattern 43*a* may directly contact the first through-electrode 11 through a through a via hole extending through the first redistribution insulating layer 41*a*. The second redistribution pattern 43*b* may directly contact the first redistribution pattern 43*a* through a via hole extending through the second redistribution insulating layer 41*b*. The second redistribution pattern 43*b* may directly contact the first back pad 21. For example, as shown in the exemplary embodiment of FIG. 2D, an upper surface of the second redistribution pattern 43*b* may directly contact a lower surface of the first back pad 21.

Connection (or coupling) structures between the second back pads 121, the inter-metal compound patterns 131 and the second conductive bumps 427 of the second to fourth semiconductor chips 100*a*, 100*b* and 100*c* may be the same/similar as described with reference to the exemplary embodiments of FIGS. 2A to 2D. Here, the second back pads 121 may correspond to the first back pad 21.

Figure 3A:
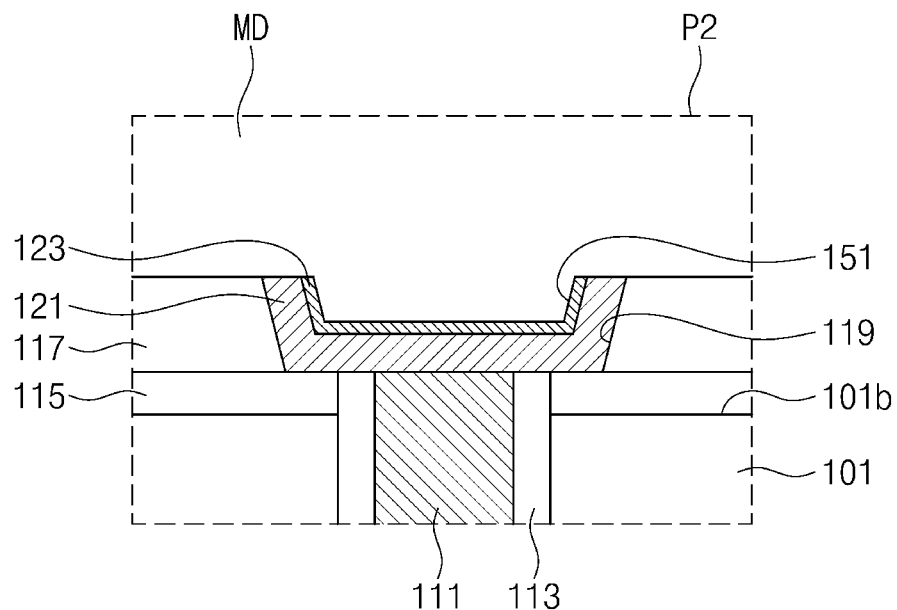
FIGS. 3A to 3C are enlarged views of portion P2 of FIG. 1 according to exemplary embodiments of the present inventive concepts.
Figure 3B:
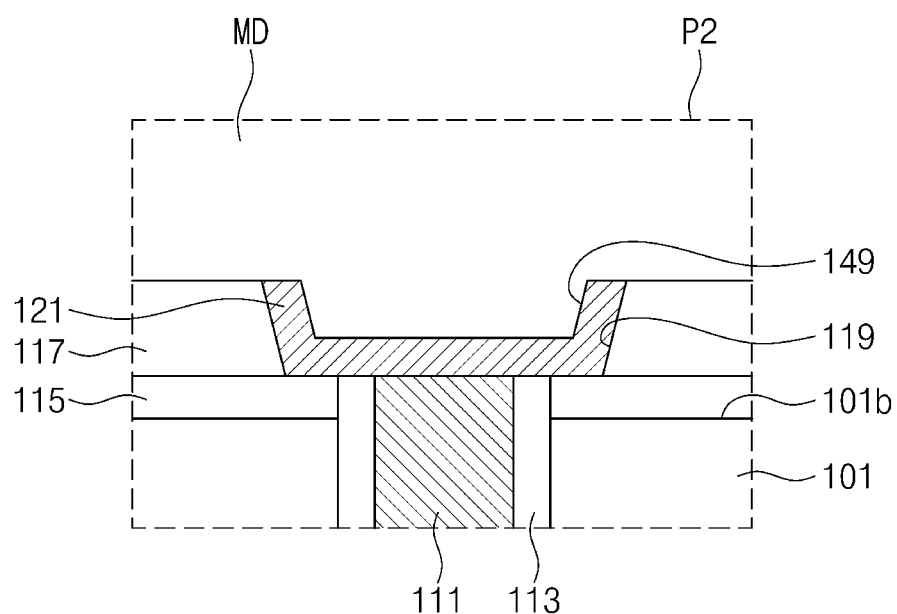
Figure 3C:
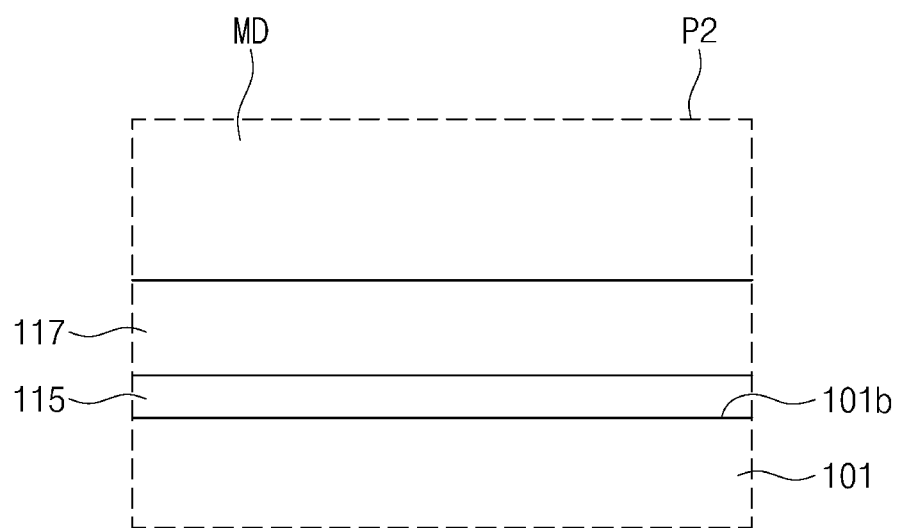

FIGS. 3A to 3C are enlarged views of portion 'P2' of FIG. 1 according to exemplary embodiments of the present inventive concepts.

Referring to the exemplary embodiment of FIG. 3A, the fourth semiconductor chip 100*c* located at the uppermost layer may include the second recess region 119 and the second back pad 121. A second conductive bonding layer 123 may be disposed on the second back pad 121. The second conductive bonding layer 123 may be conformally formed. For example, as shown in the exemplary embodiment of FIG. 3A, a profile of an inner surface of the second recess region 119 formed by the second back pad 121 may be transferred to the second conductive bonding layer 123, and thus the second conductive bonding layer 123 may include a third concave upper region 151. In an exemplary embodiment, the second back pad 121 may include the first metal. The second conductive bonding layer 123 may include the second metal. The mold layer MD may fill the third concave upper region 151 of the second conductive bonding layer 123. The mold layer MD may directly contact the second conductive bonding layer 123. For example, the mold layer MD may directly contact an upper surface of the second conductive bonding layer 123. The second conductive bonding layer 123 may cover an inner sidewall and an inner bottom surface of the second back pad 121. In another exemplary embodiment, the second conductive bonding layer 123 may cover the inner bottom surface of the second back pad 121 but may expose the inner sidewall of the second back pad 121 (similar to the shape of the first conductive bonding layer 23 covering the first back pad 21 in the exemplary embodiment of FIG. 6A).

Referring to the exemplary embodiment of FIG. 3B, the fourth semiconductor chip 100*c* located at the uppermost layer may include the second recess region 119 and the second back pad 121. The second back pad 121 may have a second concave upper region 149. The mold layer MD may fill the second concave upper region 149 of the second back pad 121. The mold layer MD may directly contact with second back pad 121. For example, the mold layer MD may directly contact an upper surface of the second back pad 121.

Referring to the exemplary embodiment of FIG. 3C, the fourth semiconductor chip 100*c* located at the uppermost layer may not include the second through-electrode 111, the second through-insulating layer 113, the second recess region 119, the second back pad 121 and the second conductive bonding layer 123 of the exemplar embodiment of FIG. 3A.

In the semiconductor package 1000 according to exemplary embodiments of the inventive concepts, the first to fourth semiconductor chips 10, 100*a*, 100*b* and 100*c* may be bonded to each other through the inter-metal compound patterns 131. Thus, the bonding strength between the first to fourth semiconductor chips 10, 100*a*, 100*b* and 100*c* may be increased. Additionally, in the semiconductor package 1000 according to exemplary embodiments of the present inventive concepts, distances between the first to fourth semiconductor chips 10, 100*a*, 100*b* and 100*c* may be maintained at least a predetermined minimum distance by the second conductive bumps 127. Thus, the underfill layers UF may be interposed between the first to fourth semiconductor chips 10, 100*a*, 100*b* and 100*c*. The underfill layers UF may reduce or relieve thermal and/or physical stress between the first to fourth semiconductor chips 10, 100*a*, 100*b* and 100*c*, and thus reliability of the semiconductor package 1000 may increased.

FIGS. 4A to 4E are cross-sectional views illustrating a method of manufacturing the semiconductor package of FIG. 1, according to exemplary embodiments of the present inventive concepts. FIGS. 5A to 5C are partial enlarged views illustrating a method of manufacturing the semiconductor package of FIG. 2A, according to exemplary embodiments of the present inventive concepts.

Figure 4A:
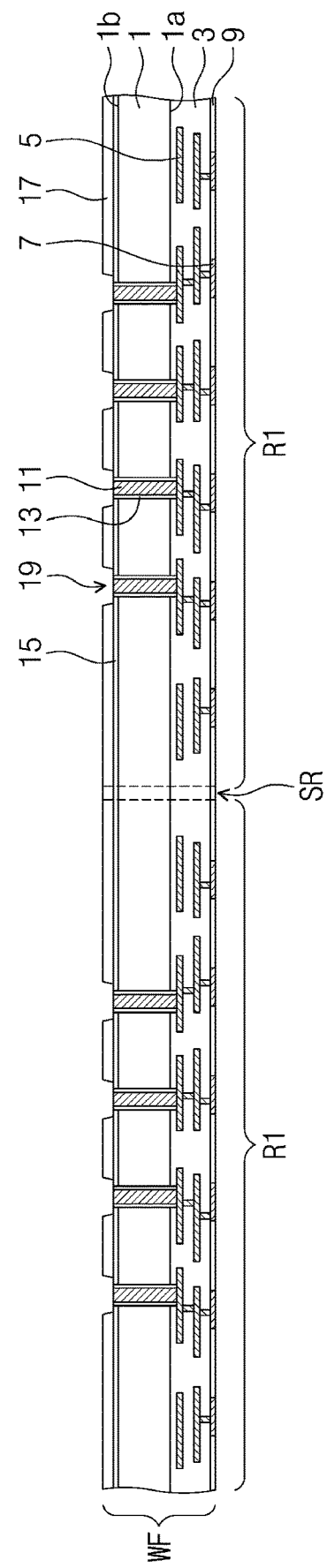
FIGS. 4A to 4E are cross-sectional views illustrating a method of manufacturing the semiconductor package of FIG. 1, according to exemplary embodiments of the present inventive concepts.
Figure 5A:
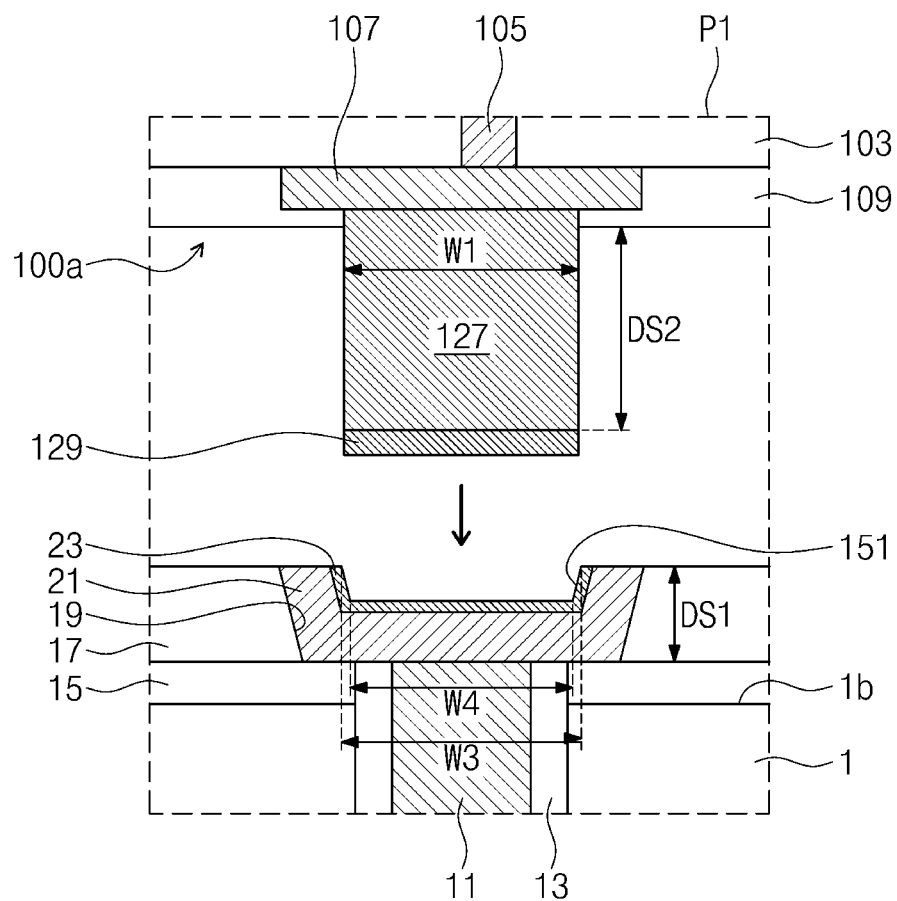
FIGS. 5A to 5C are partial enlarged views illustrating a method of manufacturing the semiconductor package of FIG. 2A, according to exemplary embodiments of the present inventive concepts.
Figure 5B:
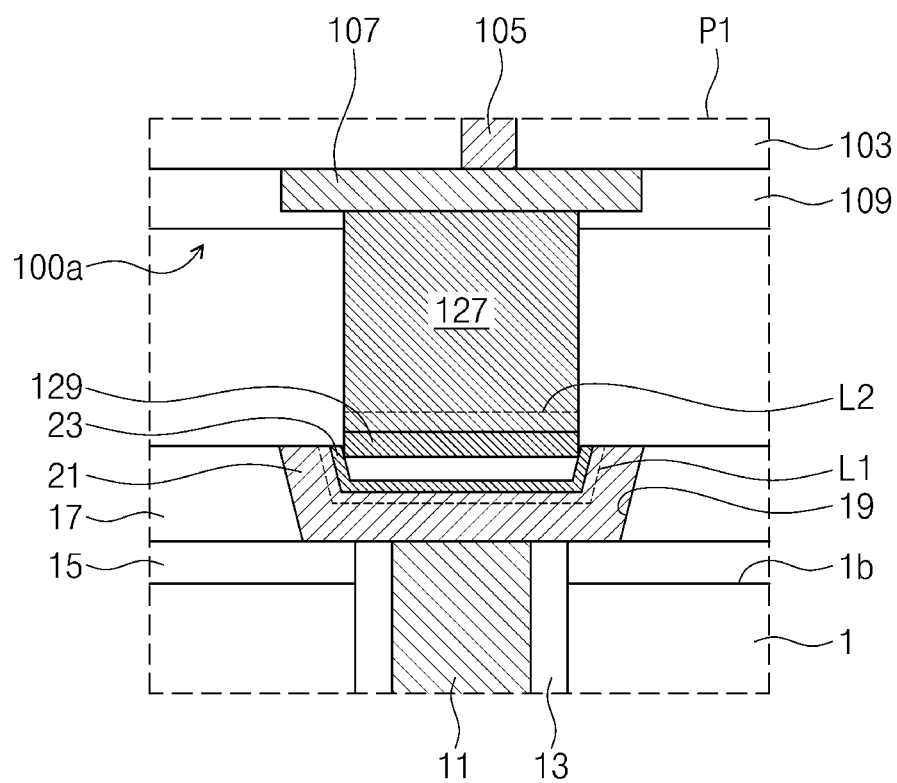
Figure 5C:
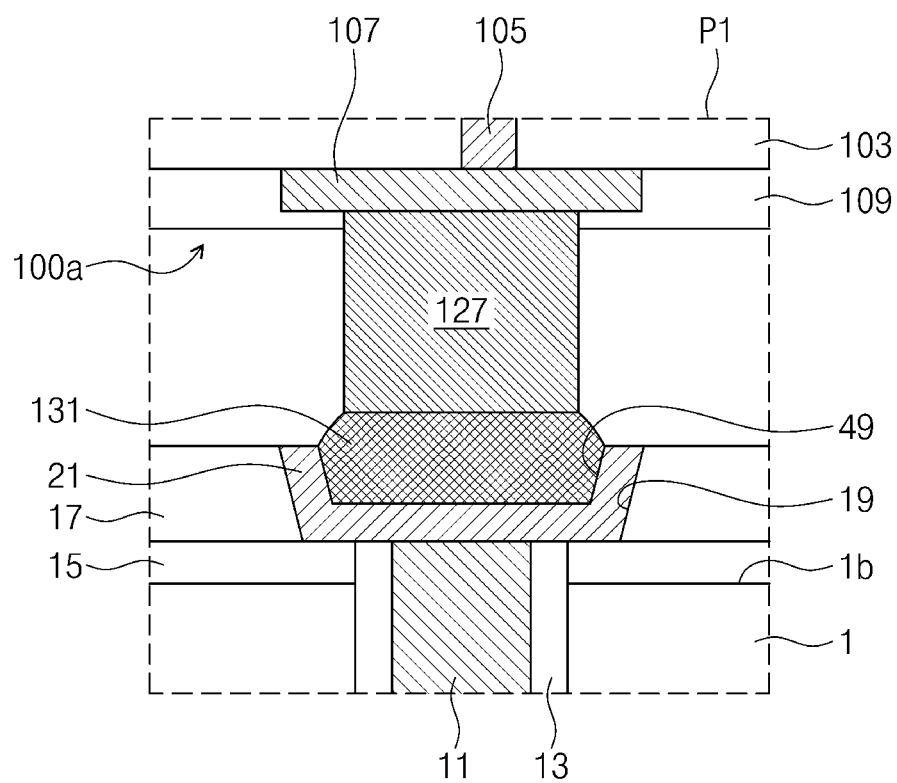

Referring to the exemplary embodiments of FIGS. 4A and 5A, a wafer structure WF may be prepared. The wafer structure WF may have a plurality of chip regions R1 and a separation region SR disposed between the chip regions R1. In an exemplary embodiment, the separation region SR may be a scribe lane region. The wafer structure W1 may include a first substrate 1. The first substrate 1 may include a front surface 1*a* and a first back surface 1*b* which are opposite to each other. First transistors and a portion of a first interlayer insulating layer 3 covering the first transistors may be formed on the front surface 1*a* of the first substrate 1. A partial portion of the first interlayer insulating layer 3 and the first substrate 1 may be etched to form a through-hole, and a first through-electrode 11 and a first through-insulating layer 13 may be formed in the through-hole. First interconnect on lines 5 connected to the first through-electrode 11 and another portion of the first interlayer insulating layer 3 may be formed. First front pads 7 and a first front passivation layer 9 may be formed on the first interlayer insulating layer 3. In an exemplary embodiment, a grinding process may be performed on the back surface 1*b* of the first substrate 1 to remove an upper portion of the first substrate 1, and thus the first through-insulating layer 13 and the first through-electrode 11 may be exposed. A first buffer layer 15 and a first back passivation layer 17 may be formed on the first substrate back surface 1*b* of the first substrate 1. The first back passivation layer 17 may have a first thickness DS1 (FIG. 5A). The first back passivation layer 17 may then be patterned to form a first recess region 19 exposing the first through-electrode 11.

Figure 4B:
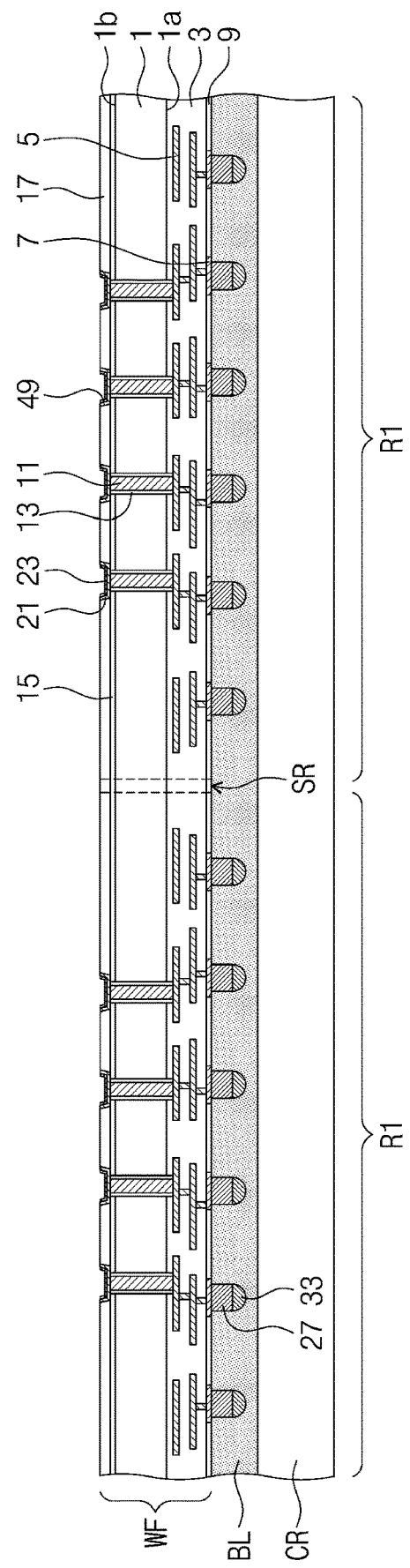

Referring to the exemplary embodiments of FIGS. 4B and 5A, plating processes may be performed in the first recess region 19 to sequentially form a first back pad 21 and a first conductive bonding layer 23. In an exemplary embodiment, each of the first back pad 21 and the first conductive bonding layer 23 may be formed to have a uniform thickness. As shown in the exemplary embodiments of FIGS. 4B and 5A, the first conductive bonding layer 23 may have a concave upper region 151 formed by a profile of an inner surface of the first recess region 19.

The first back pad 21 may include the first metal. The first conductive bonding layer 23 may include the second metal. A first conductive bump and a solder layer 33 may be formed on each of the first front pads 7. As shown in the exemplary embodiment of FIG. 4B, the wafer structure WF may be bonded to a carrier substrate CR with an adhesive layer BL interposed therebetween. In an exemplary embodiment, the adhesive layer BL may include an adhesive resin.

Figure 4C:
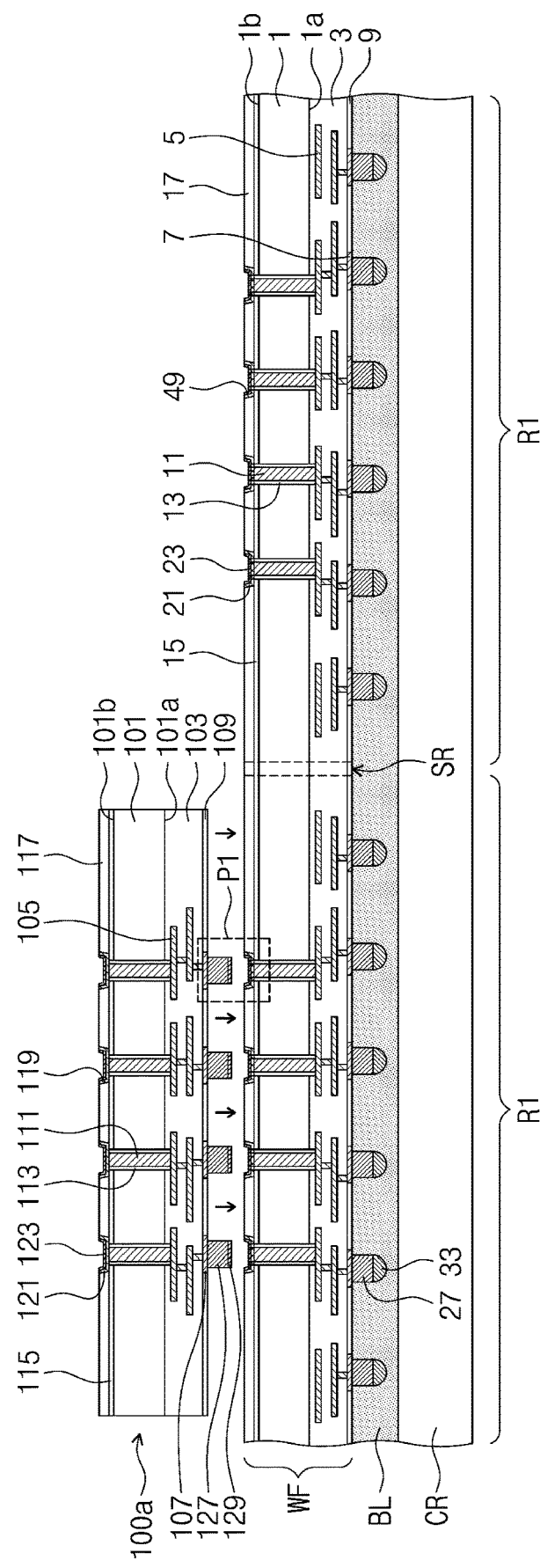

Referring to the exemplary embodiments of FIGS. 4C and 5A, a second semiconductor chip 100a may be disposed on the wafer structure WF. At this time, the second semiconductor chip 100a may have a substantially similar structure as described with reference to the exemplary embodiment of FIG. 1. However, a second conductive bonding layer 129 may be formed under the second conductive bump 127 in the second semiconductor chip 100a. The second conductive bump 127 may include the first metal. The second conductive bonding layer 129 may include the second metal. The second conductive bump 127 may be formed to have a first width W1. The second conductive bonding layer 129 may have a substantially same width as the first width W1 of the second conductive bump 127. A sidewall of the second conductive bonding layer 129 may be aligned with a sidewall of the second conductive bump 127. As shown in the exemplary embodiment of FIG. 5A, a distance DS2 by which the second conductive bump 127 protrudes from the second front passivation layer 109 (e.g., in a vertical direction) may be greater than the thickness DS1 of the first back passivation layer 17. A top of the concave upper region 151 of the first conductive bonding layer 23 may have a third width W3. A bottom of the concave upper region 151 of the first conductive bonding layer 23 may have a fourth width W4. As shown in the exemplary embodiment of FIG. 5A, the first width W1 may be less than the third width W3 and may be greater than the fourth width W4.

Referring to the exemplary embodiment of FIG. 5B, the second semiconductor chip 100a may be disposed on the wafer structure WF, and the second conductive bump 127 may be moved toward the first recess region 19. Thus, the second conductive bonding layer 129 disposed on the lower surface of the second conductive bump of the second semiconductor chip 100a may be inserted into the concave upper region 151 of the first conductive bonding layer 23.

Referring to the exemplary embodiments of FIGS. 4C, 5B and 5C, a thermal compression process may be performed in the state of FIG. 5B. The thermal compression process may be performed at a first process temperature. The first process temperature may be higher than a melting point of the second metal of the first and second conductive bonding layers 23 and 129 and may be lower than a melting point of the first metal. In addition, the first process temperature may be lower than a hardening temperature of the adhesive layer BL. For example, when the second metal is tin, the first process temperature may be in a range from about 230 degrees Celsius to about 300 degrees Celsius. By the thermal compression process, the first and second conductive bonding layers 23 and 129 may be melted and the second metal may react with the first metal of the first back pad 21 and the second conductive bump 127. Thus, an inter-metal compound pattern 131 including the first metal and the second metal may be formed. At this time, the second metal may be diffused to a first dotted line L1 in the first back pad 21 and may be diffused to a second dotted line L2 in the second conductive bump 127. Thus, the inter-metal compound pattern 131 pray be formed proximate to the first dotted line L1 and the second dotted line L2, and a thickness of the first back pad 21 and a height of the second conductive bump 127 may be reduced as compared with those of the exemplary embodiment of FIG. 5A. FIG. 5A may correspond to an enlarged view of portion 'P1' of FIG. 4C. FIG. 5C may correspond to an enlarged view of portion 'P1' of FIG. 4D.

Figure 4D:
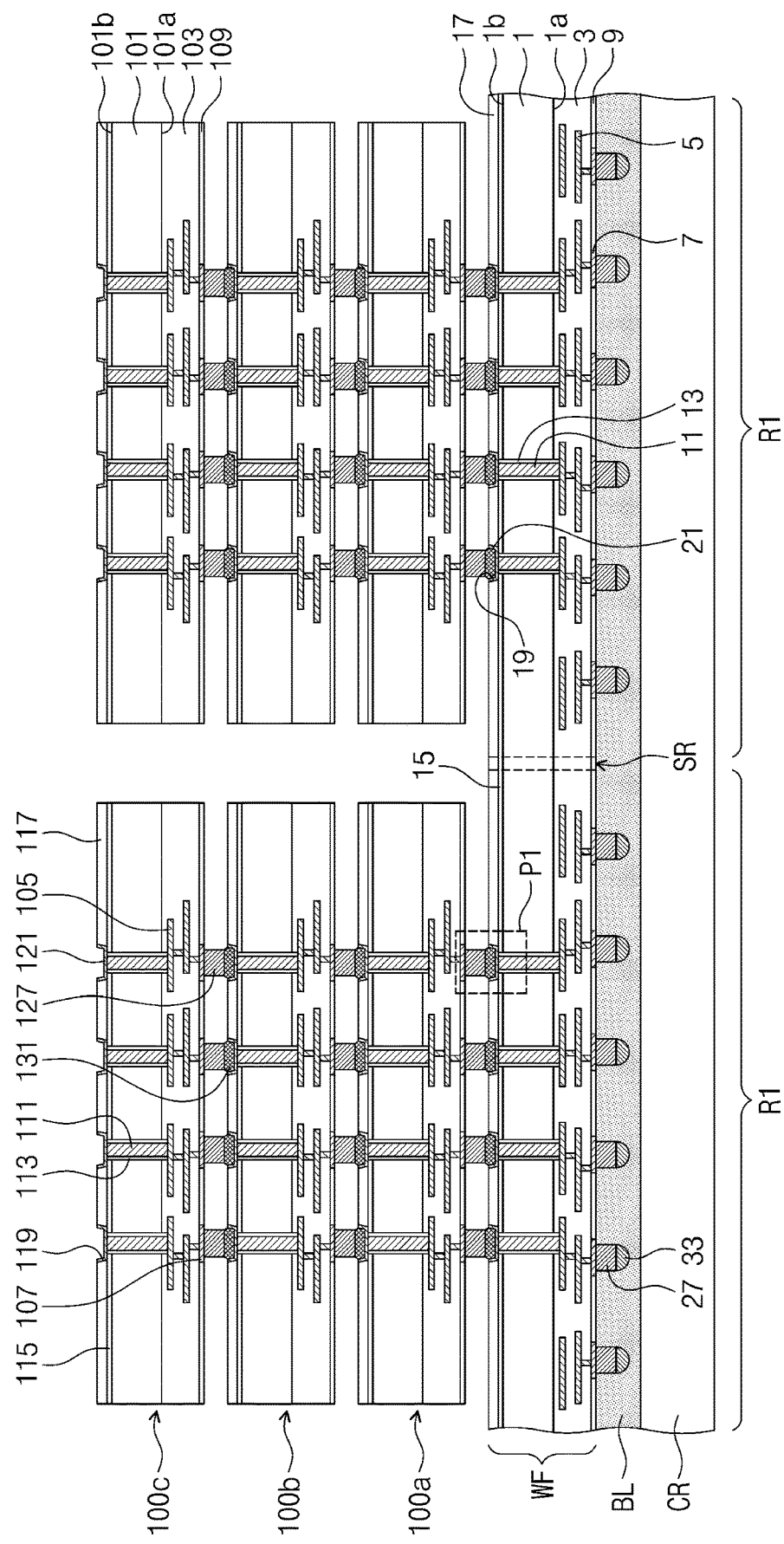

Referring to FIG. 4D, second to fourth semiconductor chips 100a, 100b and 100c may be stacked and mounted on each of the chip regions R1 by repeating the processes described with reference to the exemplary embodiments of FIGS. 4C to 5C. In an exemplary embodiment, a plurality of the thermal compression processes may be sequentially performed on the second to fourth semiconductor chips 100a, 100b and 100c, respectively. Alternatively, in an exemplary embodiment, one thermal compression process may be performed in a state in which the second to fourth semiconductor chips 100a, 100b and 100c are stacked on the wafer structure WF, thereby forming the inter-metal compound patterns 131 between the wafer structure WF and the second to fourth semiconductor chips 100a, 100b and 100c at the same time.

Figure 4E:
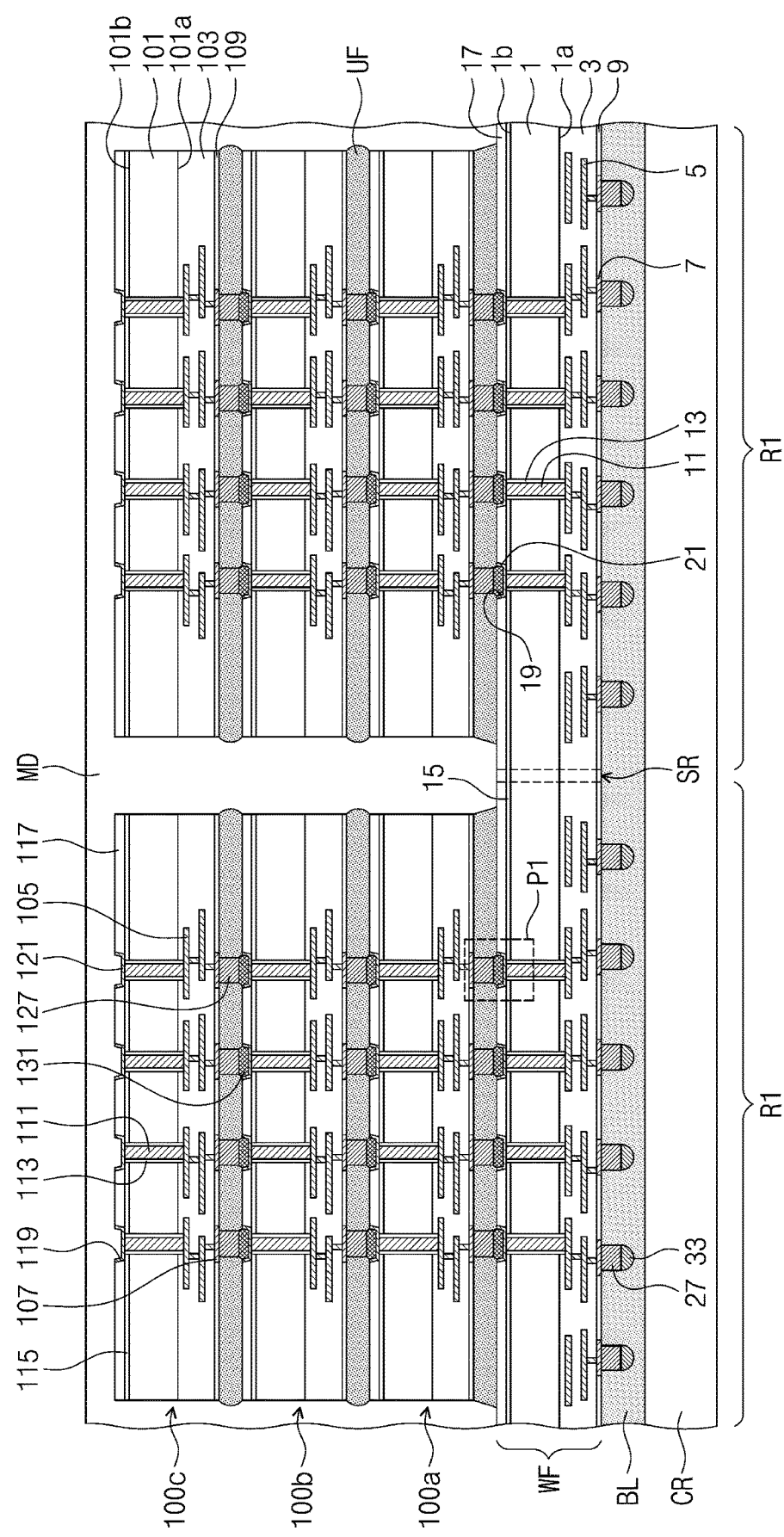

Referring to the exemplary embodiments of FIG. 4E, underfill layers UF may be formed between the wafer structure WF and the second to fourth semiconductor chips 100a, 100b and 100c. Thereafter, a mold layer MD may be formed to cover the second to fourth semiconductor chips 100a, 100b and 100c and the wafer structure WF. The carrier substrate CR and the adhesive layer BL may then be removed. In an exemplary embodiment, a singulation process using laser may be performed to remove the wafer structure WF and the mold layer MD of the separation region SR, and thus a plurality of semiconductor packages 1000 of FIG. 1 may be manufactured.

In the method of manufacturing the semiconductor package according to exemplary embodiments of the present inventive concepts, the first conductive bonding layer 23 including the second metal may be formed on the first or second back pad 21 or 121, and the second conductive bonding layer 129 including the second metal may be formed on the second conductive bump 127. Thus, the thermal compression process may be performed at a temperature lower than the melting point of the first metal or the hardening temperature of the adhesive layer BL. Therefore, hardening of the adhesive layer BL may be prevented. Accordingly, damage of the wafer structure WF when removing the carrier substrate CR may be prevented. In addition, thermal damage of the adhesive layer BL may be prevented, and thus the semiconductor package may be stably manufactured. As a result, process defects may be reduced and productivity may be increased.

Figure 6A:
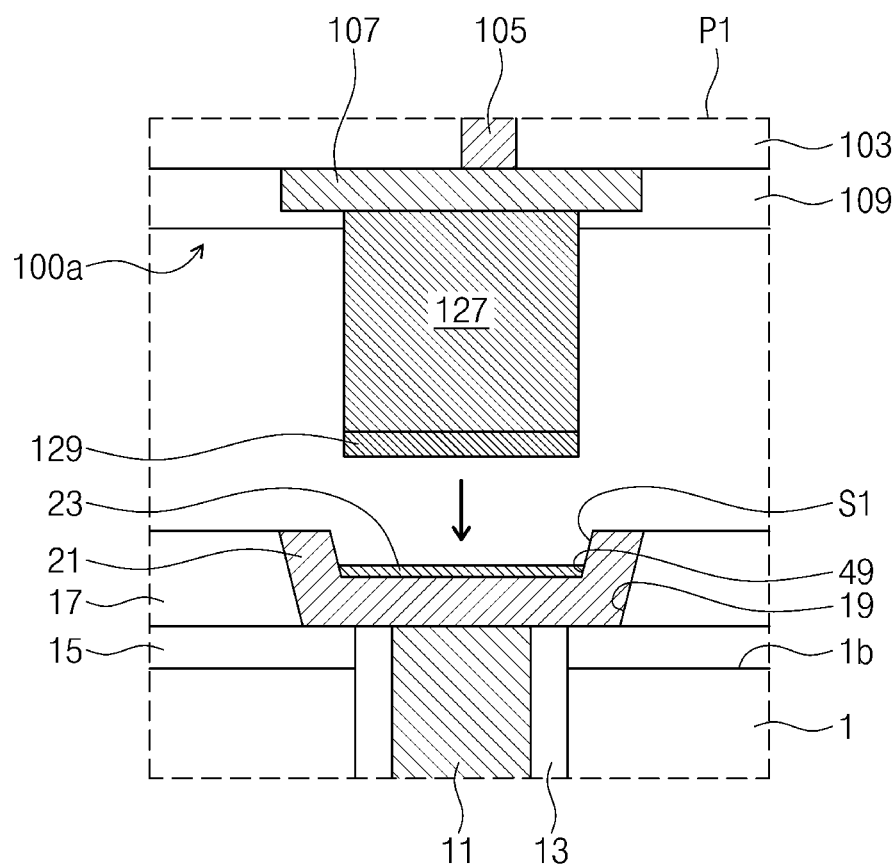
FIGS. 6A and 6B are partial enlarged views illustrating a method of manufacturing the semiconductor package of FIG. 2C, according to exemplary embodiments of the present inventive concepts.
Figure 6B:
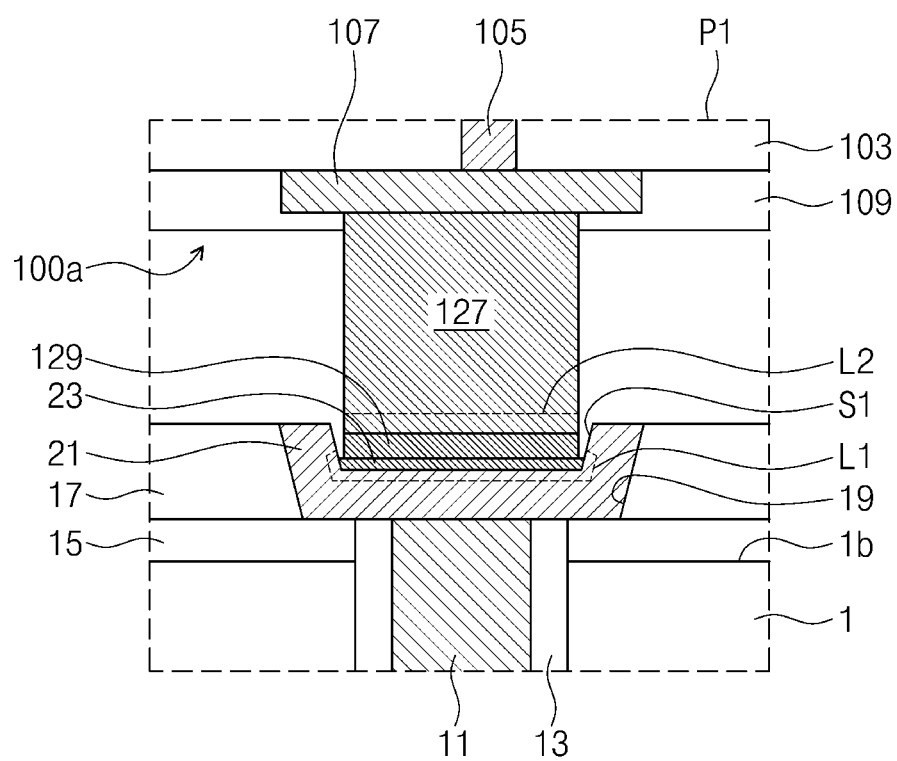

FIGS. 6A and 6B are partial enlarged views illustrating a method of manufacturing the semiconductor package of FIG. 2C, according to exemplary embodiments of the present inventive concepts.

Referring to the exemplary embodiment of FIG. 6A, a first conductive bonding layer 23 may be formed to cover a bottom surface of a concave upper region 49 of the first back pad 21 but the inner sidewalk S1 of the first back pad 21 is exposed by the first conductive bonding layer 23. The second conductive bump 1 and the second conductive bonding layer 129 of the second semiconductor chip 100a may disposed on the first conductive bonding layer 23.

Referring to the exemplary embodiments of FIGS. 6B and 2C, a thermal compression process may be performed in a state in which the first conductive bonding layer 23 is in contact with the second conductive bonding layer 129. Thus, the first and second conductive bonding layers 23 and 129 may be melted, and the second metal may react with the first metal of the first back pad 21 and the second conductive bump 127. As a result, an inter-metal compound pattern 131 including the first metal and the second metal may be formed. At this time, the second metal may be diffused to a first dotted line L1 in the first back pad 21 and may be diffused to a second dotted line L2 in the second conductive bump 127. Since the first conductive bonding layer 23 does not cover the inner sidewall S1 of the first back pad 21, the first dotted line L1 may not extend to a top end of the inner sidewall S1 of the first back pad 21. Thus, the inter-metal compound pattern 131 having the shape shown in the exemplary embodiment of FIG. 2C may be formed. Other processes may be the same/similar as described with reference to the exemplary embodiments of FIGS. 4A to 4E and 5A to 5C.

Figure 7:
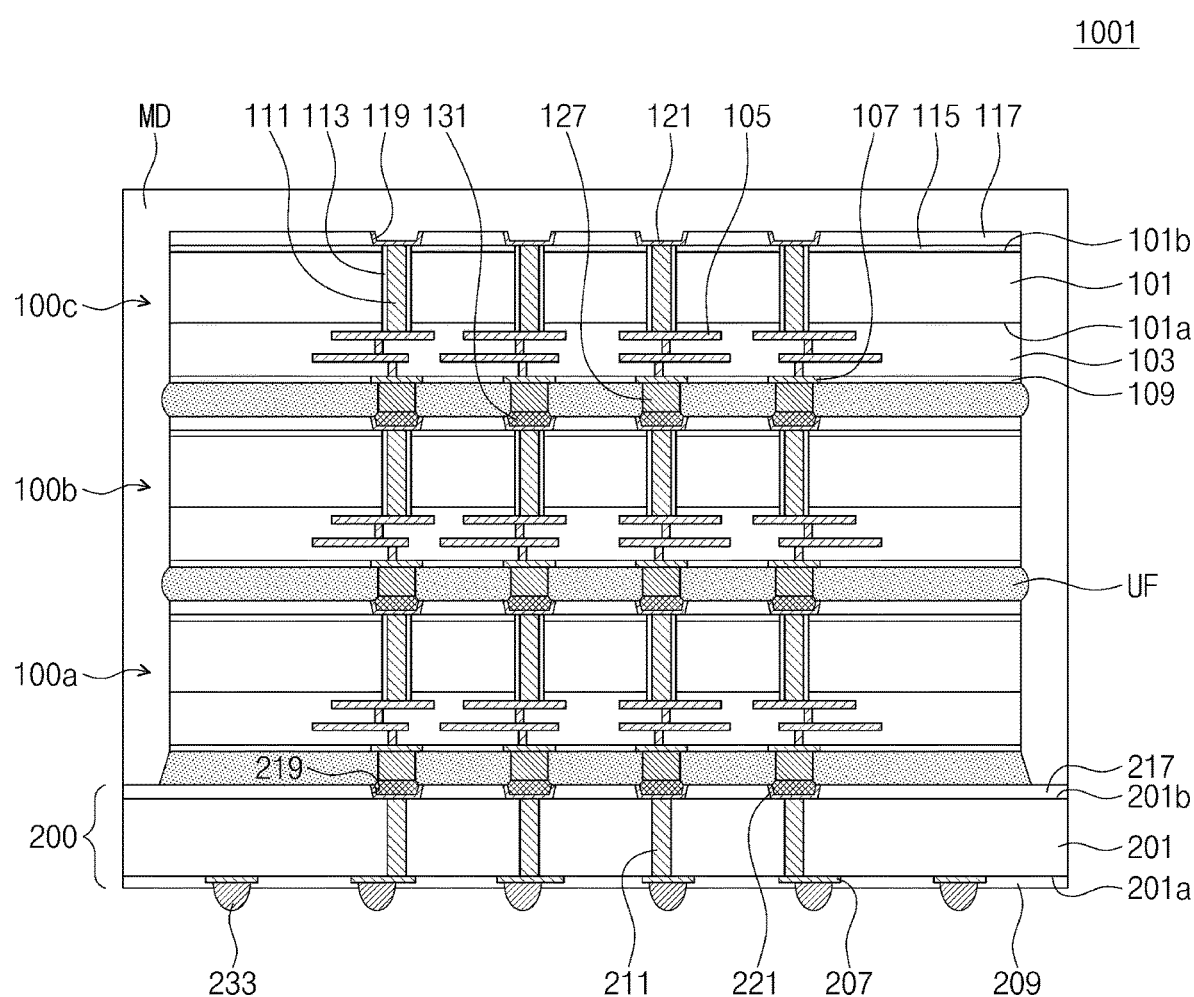
FIG. 7 is a cross-sectional view illustrating a semiconductor package according to an exemplary embodiment of the present inventive concepts.

FIG. 7 is a cross-sectional view illustrating a semiconductor package according to an exemplary embodiment of the present inventive concepts.

Referring to FIG. 7, a semiconductor package 1001 according to an exemplary embodiment may include second to fourth semiconductor chips 100a, 100b and 100c sequentially stacked on a package substrate 200. In an exemplary embodiment, the package substrate 200 may be a printed circuit board or an interposer substrate. The package substrate 200 may include a body part 201 having a first surface 201a and a second surface 201b which are opposite to each other. For example, as shown in the exemplary embodiment of FIG. 7, the second surface 201b may be adjacent to the second semiconductor chip 100a. In an exemplary embodiment, the body part 201 may include at least one of a thermosetting resin (e.g., epoxy resin), a thermoplastic resin (e.g., polyimide), a resin (e.g., prepreg) obtained by impregnating the thermosetting resin or the thermoplastic resin with a reinforcing material (e.g., a glass fiber and/or an inorganic filler), or a photocurable resin. First front pads 207 may be disposed on the first surface 201a of the body part 201 and may be covered by a first front passivation layer 209. Solder balls 233 may be bonded to the first front pads 207, respectively. A through-via 211 may penetrate the body part 201. The second surface 201b of the body part 201 may be covered by a first back passivation layer 217. The first back passivation layer 217 may include a first recess region 219 exposing the through-via 211. A first back pad 221 may be disposed in the first recess region 219. Other components may be the same/similar as described with reference to the exemplary embodiments of FIGS. 1 to 3C.

In the semiconductor package according to exemplary embodiments of the present inventive concepts, the bonding strength between the semiconductor chips may be increased by the inter metal compound pattern. In addition, the thermal and physical stress between the semiconductor chips may be reduced or relieved by the underfill layer interposed between the semiconductor chips, and thus the reliability of the semiconductor package may be increased.

In the method of manufacturing the semiconductor package according to exemplary embodiments of the present inventive concepts, the thermal compression process may be performed at a relatively low temperature. Thus, process defects may be reduced and productivity may be increased.

While the present inventive concepts have been described with reference to exemplary embodiments, it will be apparent to those skilled in the an that various changes and modifications may be made without departing from the spirits and scopes of the present inventive concepts. Therefore, it should be understood that the above exemplary embodiments are not limiting, but illustrative. Thus, the scopes of the present inventive concepts are to be determined by the broadest permissible interpretation of the following claims and their equivalents, and shall not be restricted or limited by the foregoing description.

What is claimed is:

1. A semiconductor package comprising:
   at least one second semiconductor chip stacked on a first semiconductor chip; and
   an underfill layer interposed between the first semiconductor chip and the at least one second semiconductor chip, the underfill layer is composed of an insulating resin and fillers;
   wherein the first semiconductor chip comprises: a first substrate; a first passivation layer disposed on the first substrate, the first passivation layer including a first recess region extending from an uppermost surface of the first passivation layer to a lowermost surface of the first passivation layer; and a first pad covering a bottom surface and sidewalls of the first recess region,
   wherein the at least one second semiconductor chip comprises: a second substrate; a second passivation layer disposed adjacent to the first substrate; a conductive bump protruding outside the second passivation layer towards the first semiconductor chip; and an inter-metal compound pattern disposed in the first recess region and positioned between sidewalls of the first pad, a lowermost surface of the inter-metal compound pattern is in direct contact with the first pad in the first recess region and an uppermost surface of the inter-metal compound pattern is in direct contact with the conductive bump,
   wherein the underfill layer is in direct contact with both the conductive bump and the inter-metal compound pattern and extends within the first recess region, a lowermost surface of the underfill layer tending within the first recess region is positioned below the uppermost surface of the first passivation layer,
   wherein the lowermost surface of the inter-metal compound pattern has a maximum width that is greater than a maximum width of the uppermost surface of the inter-metal compound pattern.

2. The semiconductor package of claim 1, wherein the inter-metal compound pattern protrudes from a top surface of the first pad.

3. The semiconductor package of claim 1, wherein a top surface of the inter-metal compound pattern includes a concave region disposed adjacent to the conductive bump.

4. The semiconductor package of claim 1, wherein a portion of the underfill layer is interposed between at least one inner sidewall of the first pad and at least one sidewall of the inter-metal compound pattern within the first recess region.

5. The semiconductor package of claim 1, wherein the first semiconductor chip further comprises: a first through-electrode penetrating the first substrate and directly contacting the first pad.

6. The semiconductor package of claim 1, wherein the first semiconductor chip further comprises: at least one redistribution insulating layer interposed between the first substrate and the first passivation layer; and at least one redistribution pattern disposed in direct contact with the at least one redistribution insulating layer, respectively,
   wherein the first pad is in direct contact with the at least one redistribution pattern.

7. The semiconductor package of claim 1, wherein:
the first pad and the conductive bump include a first metal; and
the inter-metal compound pattern includes an alloy of the first metal and a second metal; and
a melting point of the second metal is lower than a melting point of the first metal.

8. The semiconductor package of claim 1, further comprising:
the at least one second semiconductor chip comprises a plurality of second semiconductor chips;
a mold layer covering the first semiconductor chip and the at least one second semiconductor chip,
wherein the at least one second semiconductor chip further comprises: a third passivation layer disposed on a top surface of the second substrate, the third passivation layer including a second recess region; and a second pad covering inner sidewalls and a bottom surface of the second recess region and having a concave upper region,
wherein the mold layer fills the concave upper region.

9. The semiconductor package of claim 8, wherein the at least one second semiconductor chip further comprises:
a conductive bonding layer disposed on the second pad,
wherein the second pad includes a first metal, and the conductive bonding layer includes a second metal,
wherein a melting point of the second metal is lower than a melting point of the first metal.

10. A semiconductor package comprising:
at least one semiconductor chip stacked on a package substrate; and
an underfill layer interposed between the package substrate and the at least one semiconductor chip, the underfill layer is composed of an insulating resin and fillers;
wherein the package substrate comprises: a first passivation layer including a first recess region extending from an uppermost surface of the first passivation layer to a lowermost surface of the first passivation layer; and a first pad covering a bottom surface and sidewalls of the first recess region, the first pad having a concave top surface,
wherein the at least one semiconductor chip comprises: a conductive bump protruding toward the package substrate; and an inter-metal compound pattern disposed in the first recess region and positioned between sidewalls of the first pad, the inter-metal compound pattern is in direct contact with both the conductive bump and the first pad,
wherein the underfill layer is in direct contact with both the conductive bump and the inter-metal compound pattern and extends within the first recess region, a lowermost surface of the underfill layer extending within the first recess region is positioned below the uppermost surface of the first passivation layer.

11. The semiconductor package of claim 10, wherein the inter-metal compound pattern protrudes from a top surface of the first pad.

12. The semiconductor package of claim 10, wherein a top surface of the inter-metal compound pattern includes a concave region disposed adjacent to the conductive bump.

13. The semiconductor package of claim 10, wherein a portion of the underfill layer is interposed between at least one inner sidewall of the first pad and at least one sidewall of the inter-metal compound pattern.

14. A semiconductor package comprising:
at least one second semiconductor chip stacked on a first semiconductor chip; and
an underfill layer interposed between the first semiconductor chip and the at least one second semiconductor chip, the underfill layer is composed of an insulating resin and fillers;
wherein the first semiconductor chip comprises: a first substrate; a first through-electrode penetrating the first substrate; a first passivation layer disposed on the first substrate and including a first recess region exposing the first through-electrode, the first recess region extending from an uppermost surface of the first passivation layer to a lowermost surface of the first passivation layer; and a first pad covering a bottom surface and sidewalls of the first recess region, the first pad is in direct contact with the first through-electrode,
wherein the at least one second semiconductor chip comprises: a second substrate; a second passivation layer adjacent to the first substrate; a conductive bump protruding outside the second passivation layer toward the first semiconductor chip; and an inter-metal compound pattern disposed in the first recess region and positioned between sidewalls of the first pad, the inter-metal compound has an uppermost surface in direct contact with a lowermost surface of the conductive bump and a lowermost surface in direct contact with the first pad,
wherein the underfill layer is in direct contact with both the conductive bump and the inter-metal compound pattern and extends within the first recess region, a lowermost surface of the underfill layer extending within the first recess region is positioned below the uppermost surface of the first passivation layer, and
wherein a maximum width of the lowermost surface of the conductive bump is less than a maximum width of the lowermost surface of the inter-metal compound pattern.

15. The semiconductor package of claim 14, wherein the inter-metal compound pattern protrudes from a top surface of the first pad.

16. The semiconductor package of claim 14, wherein a top surface of the inter-metal compound pattern includes a concave region disposed adjacent to the conductive bump.

17. The semiconductor package of claim 14, wherein a portion of the underfill layer is interposed between at least one inner sidewall of the first pad and at least one sidewall of the inter-metal compound pattern within the first recess region.

18. The semiconductor package of claim 14, wherein a lower portion of the inter-metal compound pattern has a width that is greater than a width of an upper portion of the inter-metal compound pattern.

19. The semiconductor package of claim 14, wherein:
the first pad and the conductive bump include a first metal;
the inter-metal compound pattern includes an alloy of the first metal and a second metal; and
a melting point of the second metal is lower than a melting point of the first metal.

* * * * *